United States Patent
Huang et al.

(10) Patent No.: US 6,794,598 B2
(45) Date of Patent: Sep. 21, 2004

(54) ARC ELECTRODES FOR SYNTHESIS OF CARBON NANOSTRUCTURES

(75) Inventors: Houjin Huang, Kanagawa (JP); Hisashi Kajiura, Kanagawa (JP); Mitsuaki Miyakoshi, Kanagawa (JP); Atsuo Yamada, Kanagawa (JP); Masashi Shiraishi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/433,028

(22) PCT Filed: Dec. 7, 2001

(86) PCT No.: PCT/JP01/10712

§ 371 (c)(1),
(2), (4) Date: Jul. 25, 2003

(87) PCT Pub. No.: WO02/47109

PCT Pub. Date: Jun. 13, 2002

(65) Prior Publication Data

US 2004/0050686 A1 Mar. 18, 2004

(30) Foreign Application Priority Data

Dec. 8, 2000 (JP) .......................................... 2000-375044

(51) Int. Cl.[7] ............................ B23K 15/00; D01F 9/12
(52) U.S. Cl. ................ 219/121.11; 373/60; 219/121.56; 204/173
(58) Field of Search .............................. 373/60, 61, 62, 373/63, 66; 219/121.11, 121.36, 121.37, 121.38, 121.54, 121.55, 121.56, 121.57; 204/173; 423/445 B, 447.1, 447.7; 205/104, 192, 157; 428/411.1, 446

(56) References Cited

U.S. PATENT DOCUMENTS

| | | | |
|---|---|---|---|
| 5,876,684 A | * | 3/1999 | Withers et al. ......... 423/445 B |
| 6,063,243 A | | 5/2000 | Zettl et al. |
| 6,149,775 A | | 11/2000 | Tsuboi et al. |
| 2002/0046953 A1 | * | 4/2002 | Lee et al. .................... 205/104 |
| 2004/0052289 A1 | * | 3/2004 | Chang ......................... 373/60 |

FOREIGN PATENT DOCUMENTS

JP          11-263609          11/2000

OTHER PUBLICATIONS

Colbert et al., *Growth and Sintering of Fullerene Nanotubes*, Science, vol. 266, Nov. 1994, pp. 1218–1222.
Lamb et al., *Fullerene Production*, J. Phys. Chem. Solids, vol. 54, No. 12, (1993) pp. 1635–1643.
Ando et al., *Mass production of single–wall carbon nanotubes by the arc plasma jet method*, Chemical Physics Letter, vol. 323 (2000) pp. 580–585.
Saito et al., *Encapsulation of Tic and HFC Crystallites within Graphite Cages by Arc Discharge*, Carbon, vol. 35, No. 12, (1997) pp. 1757–1763.

* cited by examiner

Primary Examiner—Tu Hoang
(74) Attorney, Agent, or Firm—Bell, Boyd & Lloyd LLC

(57) ABSTRACT

An arc electrode structure, for producing carbon nanostructures, which includes a first electrode and two or more second electrodes disposed within a chamber is provided. The electrodes are connected to a voltage potential to produce an arc-plasma region. The first electrode has a sloped surface with a plurality of holes therein for holding catalyst. The first electrode's sloped surface, and the positioning of the plurality of second electrodes allows control of the direction and region of arc-plasma. Further, the first electrode has a central bore which may be either a blind bore, or a through bore. The blind bore collects unwanted deposits that slide off of the sloped surface of the first electrode. The throughbore either allows soot and carbon nanostructures to be removed from the chamber, or allows organic vapor to be introduced into the chamber. When the throughbore is used to introduce organic vapor into the chamber, the vapor is directed through the arc-plasma region so that carbon nanostructures are built up by a CVD process rather than being broken off of carbon electrodes.

30 Claims, 4 Drawing Sheets

ARC ELECTRODES FOR SYNTHESIS OF CARBON NANOSTRUCTURES

CROSS REFERENCE TO RELATED APPLICATIONS

The present invention claims priority to Japanese Patent Document No. 2000-375044 filed on Dec. 8, 2000, the discloser of which is incorporated herein by reference.

BACKGROUND OF THE INVENTION

The present invention relates to an arc electrode structure for synthesis of carbon nanostructures, and a method for producing carbon nanostructures therewith. More particularly, the invention relates to an arrangement of electrodes for producing an arc-plasma discharge to synthesize carbon nanostructures by consumption of carbon-containing electrodes, or by a chemical vapor deposition (CVD) process. Carbon nanostructures that may be produced include for example, single wall nanotubes (SWNTs), multi-wall nanotubes (MWNTs), fullerenes, endohedral metallofullerenes, carbon nanofibers, and other carbon-containing nano-materials.

Carbon nanostructures are generally known to be produced by arc-discharge between one anode and one cathode. See, for example: Japanese 11-263609, published Sep. 28, 1999; "Growth and Sintering of Fullerene Nanotubes" by D. T. Colbert et al., Science Magazine, vol. 266, Nov. 18, 1994; "Fullerene Production" by Lowell D. Lamb et al., Journal of Phys. Chem. Solids, vol. 54, No. 12, pp 1635-143, Elsevier Science, Ltd. Great Britain, 1993; and U.S. Pat. No. 6,063,243. Because only one anode and one cathode are used, a limited arc-plasma region is obtainable. Further, the electrodes include flat surfaces which oppose one another. Because only flat electrode surfaces oppose one another, it is difficult, if not impossible, to control the direction and region of arc-plasma. Consequently, it is difficult to control the final carbon nanostructure produced. Further, the area outside of the arc-plasma region quickly drops in temperature. Due to the limited size of the arc-plasma region, and due to the low temperature outside of the arc-plasma region, the reaction species are quenched quickly, not heat annealed. Such quick quenching of the reaction species leads to a high production of amorphous carbon and other unwanted species, resulting in a low yield of carbon nanostructures. Therefore, only short SWNTs may be produced by these apparatuses and methods.

Typically anodes are carbon rods having catalyst mixed therein. Catalysts having a low boiling or sublimation point easily run out of the hot electrodes and, therefore, are not fully utilized.

During soot generation, soot is generally deposited on the inner walls of the arc electrode chamber and, thus, must be harvested. As noted in "Fullerene Production" by Lamb et al., harvesting soot presents real health risks. Therefore, soot harvesting must be done carefully which typically means slowly and at a large expense. Therefore, soot harvestation is tough work, especially in big chambers.

Lastly, in traditional arc-CVD apparatuses, organic vapor is introduced through an inlet other than the center of the electrode. That is, in conventional structures, gaseous reaction species are introduced to the side of an arc-plasma discharge region. See "Mass production of single-wall carbon nanotubes by the arc plasma jet method", by Ando et al., Chemical Physics Letters 323, Elsevier Science B.V., Jun. 23, 2000. Therefore, the organic vapor is not preheated by the hot electrode, and is not introduced into the arc plasma region completely and evenly, which results in a low yield of SWNTs. Also, neither of the electrodes are cooled with the flowing organic vapor. Moreover, because the organic vapor passes by the side of the arc-plasma region, there is both a considerable amount of unused organic vapor, and a considerable portion of the arc-plasma region that is underused.

In another typical CVD apparatus, gas is passed through a rotating tube heated by a furnace. In order to keep the tube from melting, however, this process can only be performed at about 1000° C. Therefore, due to this temperature limitation, a large amount—up to about 90%—of the gas is unused or wasted. Accordingly, this process has a very low efficiency.

SUMMARY OF THE INVENTION

The present invention relates to improved arc electrode structures, and related apparatusses. For example, the present invention relates to an arc electrode structure for efficiently producing carbon nanostructures and, in particular, SWNTs, wherein the yield of SWNTs is increased.

The present invention allows the direction and region of arc plasma to be adjusted so that the final product is controllable. That is, because the present invention in an embodiment, includes an annular electrode having a sloped surface, the direction and region of arc-plasma easily can be adjusted. Additionally, because the electrode includes a sloped surface, it is automatically cleaned. That is, deposits, that would have otherwise collected on a flat electrode surface, slide off of the sloped surface of the present invention's electrode, thereby cleaning the electrode surface. Further, the sloped surface of the electrode, in an embodiment, includes a plurality of holes therein for holding catalyst, even as it reaches its boiling or sublimation point. The holes have varying depths so that catalyst is continuously, and uniformly, distributed throughout the arc-plasma region during the entire duration of arc-discharge.

In addition to a sloped surface on one of the electrodes, the present invention in an embodiment, includes a plurality of second electrodes disposed in opposition to the first-electrode's sloped surface. The provision of at least two second electrodes contributes to the adjustability of the direction and region of arc-plasma. The second electrodes are positioned so that their arcs combine to produce a larger, hotter, arc-plasma region which leads to a longer reaction time. The longer reaction time, in turn, results in longer SWNTs, and an increased yield thereof.

In a further embodiment of the present invention, an arc electrode structure is provided which allows the carbon nanostructures easily to be collected, and heat annealed. A first electrode has a central through bore therein. The through bore is connected to an outlet tube which, in turn, is connected to a collection box a pump. The pump draws the soot through the central bore and into the collection box so that soot is not deposited on the inner walls of the electrode chamber. In such a manner, the soot is easily, safely, and quickly collected. Further, as the soot is drawn through the central bore of the hot electrode, it is heat annealed, thereby perfecting the nanostructure. That is, as the soot travels along the central bore, the heat from the electrode allows a longer reaction time which produces longer SWNTs, and allows the removal of dangling bonds on the nanostructure.

Alternatively, instead of using the first electrode's central through bore to remove soot from the electrode chamber, the central through bore can be used to introduce organic vapor, gas (including inert gas), and catalyst into the electrode chamber. That is, the apparatus of the present invention in an embodiment may be used to build carbon nanostructures, by CVD, from gaseous raw materials instead of from breaking apart carbon electrodes. Thus, by selecting the gases introduced to the arc-plasma region, the type and size of the carbon nanostructures easily can be controlled. Because the gases are introduced through the central bore in one of the electrodes, they are preheated before reaching the arc-plasma region, thereby increasing the yield of carbon nanostructures. Similarly, the introduction of gases through the electrode cools the electrode, thereby increasing safety and the electrode's useful life. Further, because the gases are introduced through the center of the electrode, and the arc-plasma region is located above the central through bore, the gases must pass through the arc-plasma region, and a greater portion of the arc-plasma region is used. By introducing the organic vapor in such a manner, the amount of unused gas is reduced, which, in turn, reduces the cost of producing carbon nanostructures.

Additional features and advantages of the present invention are described in, and will be apparent from, the following Detailed Description of the Invention and the figures.

DETAILED DESCRIPTION OF THE INVENTION

The present invention generally relates to arc electrodes. More specifically, the present invention relates to arc electrodes for synthesis of carbon nanostructures and methods of making carbon nanostructures using same.

Figure 1:
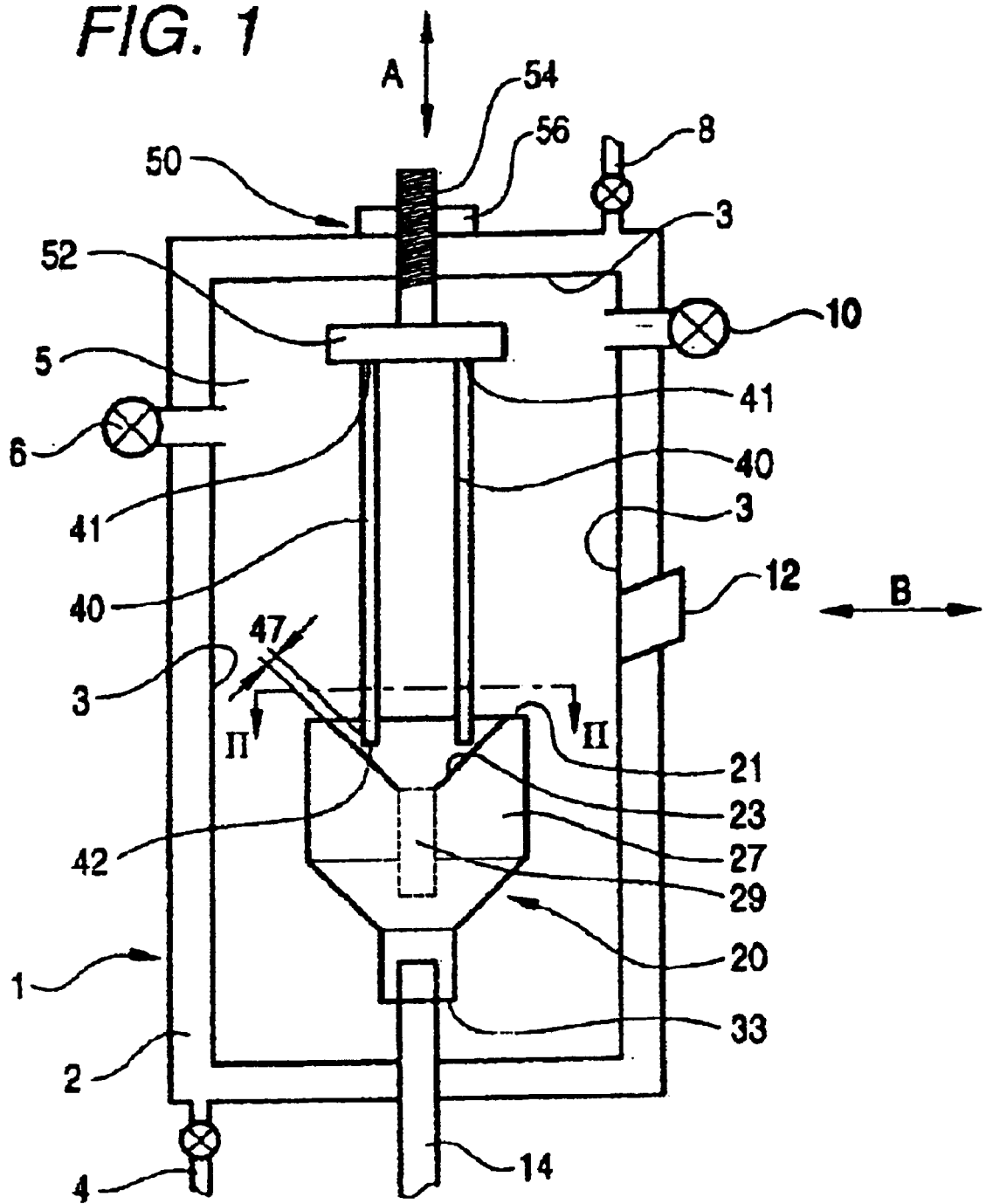
FIG. 1 is a schematic view of a chamber and arc electrodes, according to an embodiment of the present invention, for producing carbon nanostructures.
Figure 2:
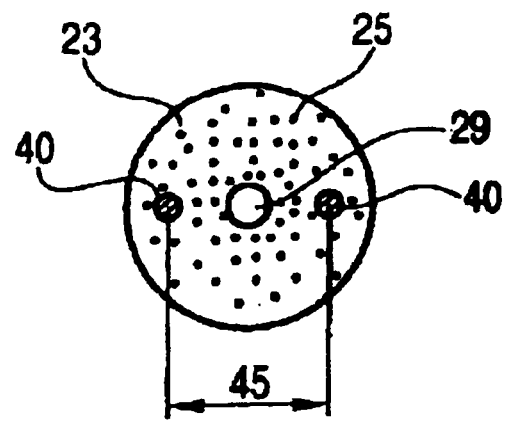
FIG. 2 is a schematic partial cross-sectional view, as taken along line II-II of FIG. 1, of the arc electrodes pursuant to an embodiment of the present invention.
Figure 3:
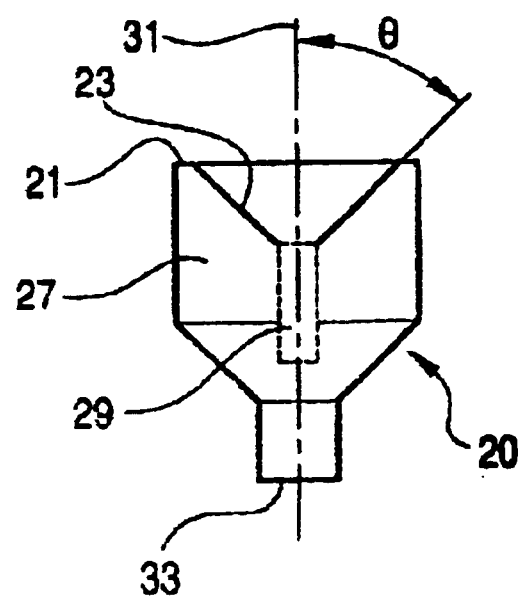
FIG. 3 is a schematic side view of one of the arc electrodes as shown in FIG. 1 according to an embodiment of the present invention.

An embodiment of the present invention is shown in FIGS. 1–3. The apparatus for producing carbon nanostructures includes a chamber 1, a first electrode 20, one or more second electrodes 40, and an adjusting mechanism 50.

The chamber 1 includes walls 2 which bound a chamber interior 5. The walls 2 are structured to allow a cooling fluid to flow therethrough. The cooling fluid may be introduced through a cooling-fluid inlet port 4, and may exit through a cooling-fluid outlet port 8, so as to cool the chamber interior 5. Additionally, the chamber 1 includes an inlet 6 and an outlet 10 so that a gas atmosphere can be produced in the chamber interior 5. The gas atmosphere may include any of the inert gases such as, for example, helium or argon. Further, the gas atmosphere may include hydrogen, or a mixture of hydrogen and an inert gas, and is typically about 300 Torr to about 760 Torr. The particular composition of the gas atmosphere depends on which carbon nanostructure one desires to produce. Further, the chamber additionally includes an observation window 12 so that the user may observe the first electrode 20 and one or more second electrodes 40 disposed in the chamber interior 5.

The first electrode 20 includes a first end 21, a second end 33, and a body 27 extending along a longitudinal axis 31 therebetween. The body 27 has a blind central bore 29 disposed therein. That is, the central bore 29 does not extend entirely through the first electrode 20 from the first end 21 to the second end 33. The first electrode 20 is connected to a voltage potential, and is mounted within the chamber interior 5, by a connector 14 mounted to the second end 33.

The first end 21 includes a sloped surface 23 which slopes toward the central bore 29. The sloped surface 23 is disposed at an angle θ with respect to the longitudinal axis 31. See FIG. 3. The angle θ may be from about 20° to about less than 60°, but preferably is between about 30° and about 45°. The angle θ is chosen so that the sloped surface 23 affects cleaning of the first electrode 20, and also affects the shape of the arc between the first electrode 20 and the one or more second electrodes 40.

The sloped surface 23 assists in cleaning the first end 21 of the first electrode 20 during production of carbon nanostructures. That is, when a voltage is applied across the first electrode 20 and the one or more second electrodes 40, deposits tend to form on the first end 21. Due to the sloped surface 23, however, the deposits slide off of the first end 21 and into the central bore 29. As angle θ becomes larger, the sloped surface 23 flattens, and deposits will not slide off thereof.

Additionally, the sloped surface 23 assists in forming the shape of the arc produced by the first 20 and second 40 electrodes. When two or more second electrodes 40 are used, as is preferred, the sloped surface 23 allows the direction and region of arc plasma to be adjusted so that the final product may be controlled. That is, as the angle θ becomes smaller, the arc plasma region of each second electrode 40 is directed more toward the center of the first electrode 21 and less of the arc-plasma region is located above the end of the second electrode 40, i.e., less is located radially outward along the sloped surface 23 of the first electrode 20. And when the arcs plasma regions from two or more second electrodes 40 are directed toward the center of the first electrode 21, the arcs combine and, thereby, produce an even larger, hotter, arc-plasma region which increases the reaction time. Consequently, yield and size of carbon nanostructures are increased. As the angle θ becomes large, the first end 21 of the first electrode 20 flattens and approaches the conventional art electrode structure—i.e., that where θ=90°—in which it is difficult, if not impossible, to control the direction and region of arc plasma.

Further, as shown in FIG. 2, the sloped surface 23 has a plurality of holes 25 disposed thereon. The holes 25 hold catalysts used during the production of carbon nanostructures. Because catalyst is held in the holes 25, it is easy to change catalysts for different discharges. That is, the first electrode 20 is not consumed during discharge, so the holes 25 retain their shape and ability to hold catalyst. Therefore, the holes 25 merely need to be cleaned out and filled with a new catalyst.

Each of the holes 25 has a depth of from about 2 mm to about 10 mm, but preferably about 5 mm. If the holes 25 are too deep, the catalyst will melt, settle at the bottom of the hole and, thus, not be available for reaction at the sloped surface 23 of the first electrode 20. Thus, a depth is chosen so that even when the catalyst melts or sublimes, it is held in the hole 25 and is close enough to the sloped surface 23 so that it can be used.

Further, each of the holes 25 has a diameter from about 3 mm to about 10 mm, when the diameter of the first-electrode first end 21 is about 20 cm, and the diameter of the central bore 29 is about 4 cm. Preferably, however, the diameter of each hole 25 ranges from about 4 mm to about 8 mm. If the diameter of each hole 25 becomes too large, a sufficient number of holes cannot be produced on the sloped surface 23 and, therefore, a sufficient amount of catalyst is not available for reaction. The same is true for either an increase in the diameter of the central bore 29, or an decrease in the diameter of the first-electrode first end 21, which respectively may range from about 0 cm to about 6 cm, and from about 5 cm to about 30 cm. Also, when the diameter of the holes 25 is too large, it is difficult to obtain a desirable distribution of holes 25 in relation to surface area of the first electrode 20.

FIG. 2 shows the holes 25 as having the same diameter, but it is not necessary that they do. Further, it is not necessary for the holes 25 to each have the same depth. In fact, it is preferable that the holes 25 have different depths so as to continuously provide catalyst from the beginning of arc-discharge until the second electrodes 40 are consumed. That is, some of the holes 25 are shallow so that catalyst quickly evaporates therefrom, whereas other ones of the holes 25 are deeper so that the catalyst evaporates more slowly and over a longer period of time. What is important is that the holes 25 are distributed over the sloped surface 23 so as continuously to supply catalyst, by evaporation, to the arc-plasma region from the beginning of arc-discharge until the second electrodes 40 are consumed. And the more holes 25 that are present, the easier it is to achieve such a continuous, uniform, supply of catalyst during the arc-discharge.

Although the first electrode 20 is shown as being circular in cross section, any other cross-sectional shape may be used such as, for example, elliptical, rectangular, square, pentagon, hexagon, octagon, or the like. Further, in this embodiment, the first electrode 20 is made of graphite—to withstand the temperature of the arc-plasma region which, during operation, is about 4000° C.—and is connected to a negative voltage potential thereby making it the cathode.

Further, the first electrode 20 may be rotated during arc-discharge. By rotating the first electrode 20, it is easier to supply catalyst continuously throughout the time that the second electrodes 40 are consumed, and it is easier to uniformly supply catalyst to the arc plasma region. That is, by rotating the first electrode 20, the holes 25—which hold the catalyst—are moved through the arc-plasma region, and some holes 25 which may be outside of the arc-plasma region are brought into and through the arc-plasma region. Thus, catalyst is continuously and more evenly distributed throughout the arc-plasma region.

One or more second electrodes 40 are disposed in the chamber 1 so as to oppose the sloped surface 23 of the first electrode 20. When more second electrodes 40 are used, a bigger and hotter arc-plasma region can be produced. Further, the convergence, or overlap, of the arcs makes the arc-plasma region more uniform in temperature. Each of the second electrodes 40 includes a first end 41 and a second end 42. The first ends 41 are connected to an adjusting mechanism 50, whereas the second ends 42 oppose the sloped surface 23 so as to form a gap 47 between each second end and the sloped surface 23. The gap 47 is measured from the center of the second end 42 to the sloped surface 23 along a line perpendicular to the sloped surface 23, because the second electrode 40 is quickly consumed during arc-discharge and obtains a sloped surface roughly parallel to that of the sloped surface 23. In this embodiment, the second electrodes are connected to a positive voltage potential and, thus, are anodes. Further in this embodiment, because catalyst is supplied by the holes 25 in the first electrode 20, each of the second electrodes may be made of pure carbon. And pure carbon rods are less expensive than ones which include catalyst therein. Of course, one or more of the second electrodes 40 may include catalyst therein even though catalyst is supplied by the holes 25 in the first electrode 20.

The adjusting mechanism 50 connects the second electrodes 40 to the chamber 1, and to a voltage potential. The adjusting mechanism 50 includes a plate 52, a screw-threaded stud 54, and a nut 56.

The plate 52 mounts the second electrodes 40 so that the second electrodes are adjustable with respect to one another. That is, when two second electrodes 40 are used, they are adjustably spaced by a distance 45. The distance 45 is adjustable because the second electrodes are mounted to the plate 52 so that they may move toward and away from each other in the direction of arrow B. Although only two second electrodes 40 are shown in this embodiment, any number of second electrodes 40 may be used. Increasing the number of second electrodes 40 increases the possible size of the arc plasma region, increases the temperature and, hence, increases the amount of carbon nanostructures that can be produced. And when more than two second electrodes 40 are used, the plate 52 includes a mounting structure which allows each of the second electrodes 40 to be moved with respect to the remaining second electrodes 40 so that the distance 45 between each of the second electrodes 40 is adjustable. In a preferred embodiment of the invention, the distance 45 is set to about 8 cm which causes a desirable combination of the arcs. When numerous second electrodes 40 are present, they may be set on a circle having a diameter of a length equal to that of spacing 45.

Additionally, the screw-threaded stud 54 is attached to the plate 52, and extends through a wall 2 in the chamber 1. The nut 56 is attached to the screw-threaded stud 54 to mount the plate 52 and, hence the second electrodes 40, within the chamber interior 5. The nut 56 and screw-threaded stud 54 allow the second electrodes to be moved in the direction of the arrow A, so as to adjust the distance of gap 47. The nut 56 may either be adjusted manually, or by an auto-controller (not shown), to position the second electrodes 40 in relation to the first electrode 20. In a preferred embodiment of the invention, the distance of the gap 47 is set in the range of from about 2 mm to about 5 mm, and preferably in the range of from about 2 mm to about 3 mm. If the gap 47 is too large, no arc will be produced, whereas if the gap 47 is too small, only a small arc plasma region will be produced. Again, a larger sized arc plasma region produces a longer reaction time which results in larger carbon nanostructures as well as a higher yield of such structures.

The structure of the adjusting mechanism is not critical to the invention, and may be any mechanism that allows connection of the second electrodes 40 to a voltage potential, as well as one which allows adjustment of the distance 45 between second electrodes 40, and adjustment of the gap 47.

A preferred operation, for producing SWNTs, using this embodiment of the present invention will now be described.

The first electrode 20, made of graphite and having a sloped surface 23 at an angle θ of about 30° with the longitudinal axis 31, is disposed below the second electrodes

40, of pure carbon having a diameter of about 10 mm, so that unwanted deposits are collected in the blind central bore 29.

The holes 25 in the sloped surface 23 are filled—usually to their tops—with catalyst such as, for example, sulfur, phosphorous, nickel, yttrium, cobalt, the like or mixtures thereof. The type of catalyst depends on the type of carbon nanostructures to be produced. For example, by changing the catalyst any one or more of the following carbon nanostructures efficiently can be produced: single-wall nanotubes (SWNTs); multi-wall nanotubes (MWNTs); fullerenes, endohedral metallofullerenes, carbon nanofibers; and other nanostructures. For the production of SWNTs, a sulfur catalyst produces larger diameter tubes. An important feature of this embodiment is that the graphite first electrode 20 easily supplies catalyst to the arc-plasma region because it includes holes 25 on its sloped surface 23. That is, the catalyst easily can be introduced into the holes 25 and, thereafter, conveniently is supplied to the arc-plasma region. Further, because the first electrode 20 is not consumed, the holes 25 hold their shape even during arc-discharge. Therefore, the holes 25 hold the catalyst even after it reaches its boiling or sublimation point; the catalyst does not run out of the first electrode 20.

The chamber interior 5 is then filled with a gas atmosphere including inert gases such as He or Ar, a gas such as $H_2$, or a mixture thereof. Although any inert gas may be used, an atmosphere including $H_2$ tends to produce longer length SWNTs, whereas an atmosphere including He tends to produce shorter ones (note that in order to produce fullerenes, a He atmosphere must be used). After the gas atmosphere is produced in the chamber interior 5, valves on the chamber inlet 6 and chamber outlet 10 are closed so as to maintain a static gas atmosphere of about 500 Torr of $H_2$.

The second electrodes 40 are spaced at about 8 cm from one another which produces a combination arc having a large arc-plasma region. The first electrode 20 and second electrodes 40 are then brought into opposition with one another across a gap 47 of about 2 mm to about 3 mm.

Further, the first electrode 20 is connected to a negative voltage potential to act as a cathode, whereas the second electrodes 40 are connected to a positive voltage potential to act as anodes. A direct current (DC) voltage of between about 30 and about 35 volts, with a current of about 200 amps, is then applied to the first 20 and second 40 electrodes thereby producing an arc-plasma region by arc-discharge. The arc-discharge is carried out for about 30 minutes to about 1 hour to consume the anodes. As the second electrodes 40 are consumed, the adjusting mechanism 50 is operated to move the second electrodes 40 toward the first electrode 20 so as to maintain the voltage between about 30 and about 35 volts. The soot produced by consumption of the electrodes 40 includes the desired carbon nanostructures, and is disposed on the inner walls 3 of the chamber 1.

Under the above conditions, a soot production rate of about 0.3 to about 1 g/min is achieved, wherein the yield of SWNTS is greater than 50 wt %. The SWNTs produced typically are about 1.2 to about 1.8 nanometers in diameter, and are greater than about 100 micrometers in length.

Although DC voltage was described in the above operation of the apparatus, an alternating current (AC) voltage may also be used with the apparatus of the present invention. Further, although a current of about 200 amps is preferred, a current from about 100 to about 300 amps may be used.

Figure 4:
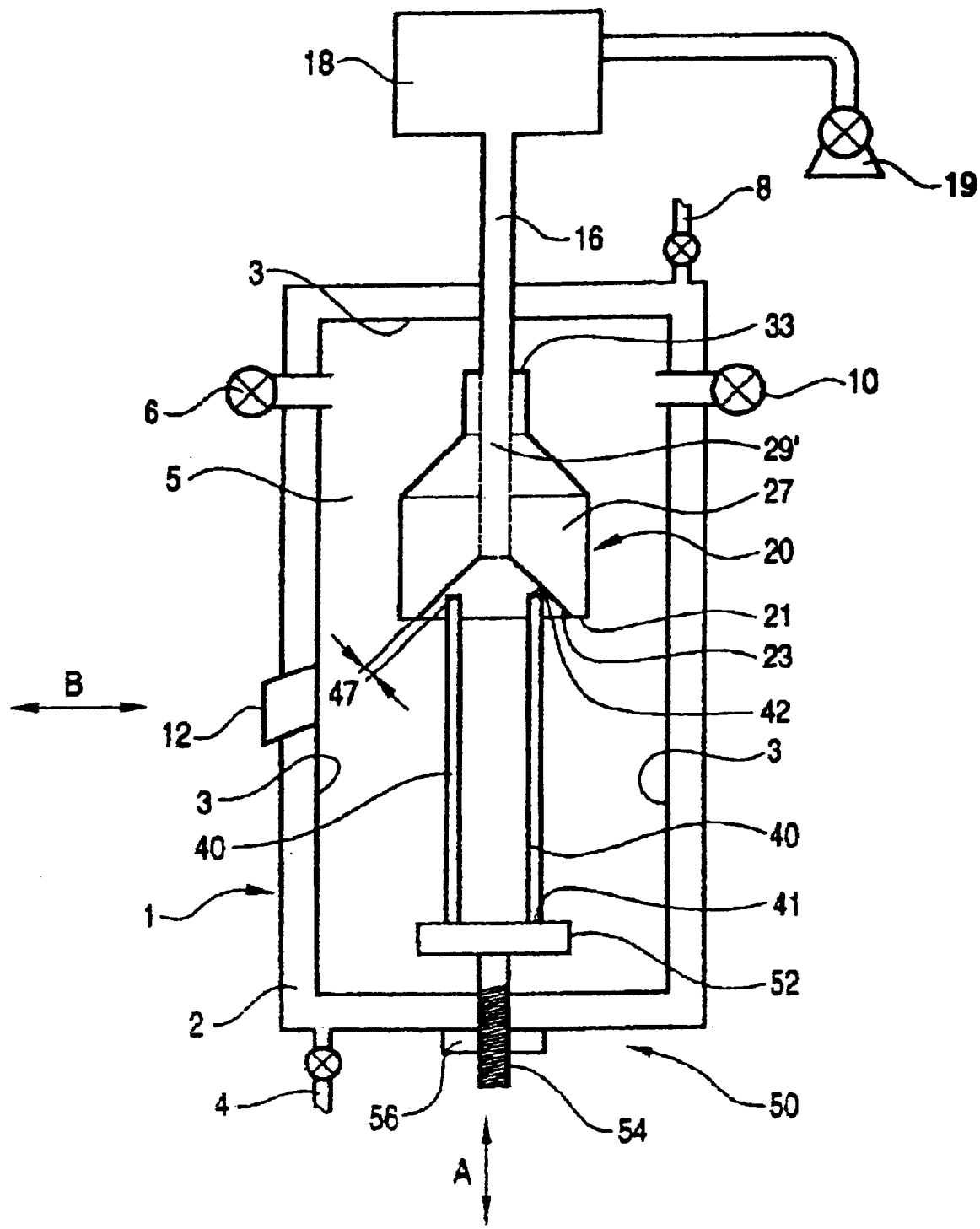
FIG. 4 is a schematic view of a chamber and arc electrodes, according to an embodiment of the present invention, for producing carbon nanostructures.

Another embodiment of the present invention is shown in FIG. 4. Elements similar to those shown and described above are given like reference numerals and, therefore, a description of such elements is omitted here.

In an embodiment of the present invention, the chamber 1 includes an outlet tube 16, a collection box 18, and a pump 19. The outlet tube 16 is connected to the first electrode 20 and to the collection box 18. The collection box 18, in turn, is connected to the pump 19. Further, the first electrode 20 includes a central bore 29' which extends entirely through the first electrode 20, and which is connected to the outlet tube 16.

Thus, the interior of the chamber 5 is in communication with the pump 19 so that soot, produced by an arc-discharge between the first 20 and second 40 electrodes, easily can be collected in the collection box 18 by operating the pump 19 to cause a flow from the chamber interior 5 to the collection box 18. The flow rate from the chamber interior 5 is set to a value sufficient to prevent an appreciable amount of soot from collecting on the inner wall surfaces 3. As the pump 19 draws soot and gas from the chamber interior 5, the chamber inlet 6 allows a corresponding amount of gas into the chamber interior 5 so as to maintain the pressure in the chamber interior 5.

This embodiment thus has the advantage of easily collecting soot. The soot, which includes byproducts and the desired carbon nanostructures, is collected in the collection box 18 instead of being deposited on the inner wall surfaces 3 of the collection chamber 1. That is, because an appreciable amount of soot is not formed on the inner wall surfaces 3 of the chamber 1, a lengthy, costly, and perhaps unsafe, soot collection process does not need to be carried out.

A further advantage of this embodiment is that the carbon nanostructures are heat annealed as they are drawn, together with the soot, through the central bore 29' of the first electrode 20. The first electrode 20 is heated by the arc-discharge. The surface of the first-electrode first end 21 reaches about 4000° C., whereas the body 27 cools as it extends away from the first end 21. Therefore, a temperature gradient is formed along the central bore 29'. As the soot is drawn through this temperature gradient, the carbon nanostructures in the soot are allowed to react longer, and become more perfect. That is, the carbon nanostructures are heat annealed, to eliminate dangling bonds, as they are drawn through the central bore 29' of the first electrode 20. The longer reaction time produced by this embodiment of the present invention may also lead to longer nanotubes and increased yield. In the production of metallofullerenes, such longer reaction time is particularly beneficial. In a preferred embodiment of the invention, the central bore 29' is about 30 cm to allow for heat annealing of the carbon nanostructures.

FIG. 4 shows the first electrode 20 disposed above the second electrodes 40 so that deposits formed on the first electrode 20 slide off to the bottom of the chamber interior 5. In such a configuration, the catalyst—in the amount of about 7.5 wt % to about 20 wt %—is contained in the second electrodes 40. But the first electrode 20 may be disposed below the second electrodes 40 and, thus, operate to supply catalyst as in the first embodiment. The advantage of being able to supply catalyst with the first electrode 20 may outweigh the disadvantage of collecting unwanted electrode deposits along with the desired nanostructures, as would occur with the first electrode 20 positioned below the second electrodes 40.

Figure 5:
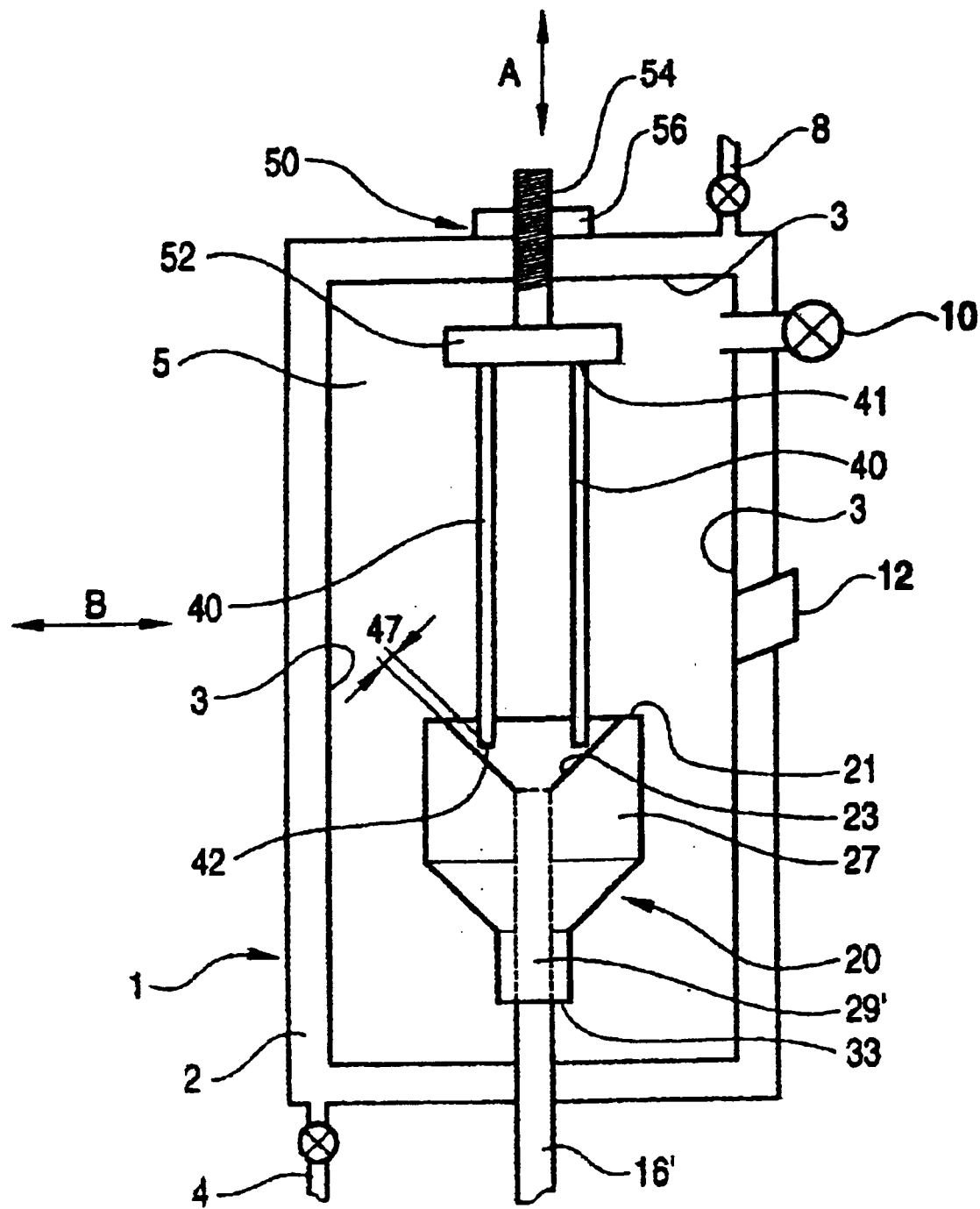
FIG. 5 is a schematic view of a chamber and arc electrodes, according to an embodiment of the present invention, for producing carbon nanostructures.

Another embodiment of the present invention is shown in FIG. 5. Elements similar to those shown and described above are given like reference numerals and, therefore, a description of such elements is omitted here. However, in this embodiment, carbon nanostructures are built up from carbon components introduced in a gaseous state. That is, this embodiment is a CVD process.

The chamber 1, for this embodiment, has an inlet tube 16', and a chamber outlet 10; a chamber inlet 6 is not necessary, but can be included if desired. That is, the inlet tube 16' is connected to the central through bore 29', of the first electrode 20, to supply gas to the arc-plasma region and to the chamber interior 5. An equivalent amount of gas is let out of the chamber 1, through chamber outlet 10, so as to maintain constant the pressure in the chamber interior 5 during arc-discharge.

It is from the components of the gas introduced through the central bore 29' that carbon nanostructures are produced, or are built up. That is, a gas containing catalyst and raw material for the carbon nanostructures is supplied to the arc-plasma region through central through bore 29'. In the arc-plasma region, sufficient energy is added to the gas to cause a reaction which produces carbon nanostructures. Before the gas reaches the arc-plasma region, however, it passes through the central throughbore 29' of the first electrode 20, which is heated by the arc-discharge. Thus, the gas is preheated before it reaches the arc-plasma region. Because the gas is preheated, a better yield of carbon nanostructures is achieved.

The gas includes catalyst and raw materials for the production of carbon nanostructures and, therefore, it is easy to control the size and production of carbon nanostructures. That is, the flow rate and concentration of the gas introduced controls the type and amount of nanostructures that are produced. For example, the gas may include organic vapor mixed with inert gas and catalyst. In such an arrangement, the organic vapor may include any one or more of $CH_4$, $CH_2=CH_2$, $CH\equiv CH$, $CH_3CH_2CH_3$ or the like; whereas the catalyst may include S, thiol thiophene, $C_{10}H_{10}Fe$, $C_{10}H_{10}Ni$, or $C_{10}H_{10}Co$, the like, used alone or in combination. Additionally, in this embodiment, the interior chamber 5 has an atmosphere which includes $H_2$, because the hydrogen cleans the surface of the catalyst, thereby increasing the yield of carbon nanostructures produced. Hydrogen can also be introduced with the organic vapor and catalysts. Further, the interior chamber has a pressure of about 1 atmosphere.

Although in this embodiment, catalyst is introduced in a gaseous state, the catalyst can also be contained either in the first electrode 40 or in the second electrodes 40 as in the previous embodiments. That is, the catalyst can be added to the arc-plasma region in any one or more of the following three manners: a) by the gas introduced through the inlet tube 16'; b) by the holes 25 in the first electrode 20; or c) by the second electrodes 40.

Further, the structure of the present invention leads to an increased efficiency in carbon nanostructure production. As noted above, the sloped surface 23 of the first electrode 20 allows control of the direction and region of arc-plasma. Hence, by selecting an appropriate angle θ, second electrode spacing 45, and electrode gap 47, the arc-plasma region can be uniformly produced over a large area above the central opening 29'. Thus, because the gas is introduced through the center of the first electrode 20, and the arc-plasma region is uniformly disposed over the central opening 29', the gas is uniformly consumed due to a more complete utilization of the entire arc-plasma region. That is, very little of the gas introduced through central bore 29' remains unconsumed because the gas must pass through the arc-plasma region. Moreover, because the gas is passed through an arc-plasma region having a temperature of 4000° C.—which is much higher than that used in typical CVD processes—the present invention achieves a much higher efficiency than that of typical CVD processes. Thus, carbon nanostructures efficiently can be produced with this embodiment of the invention.

Because the sloped surface 23 allows control of the arc-plasma region, it is possible to use only one second electrode 40, although such is not preferred. That is, it is possible to control the direction and region of arc-plasma from one second electrode 40 so that such arc-plasma region is disposed over the central opening 29'. Such arc-plasma region is not as large as that achieved with two or more second electrodes 40, however, and thus does not allow as much production capacity, yield, and quality of carbon nanostructure as in the case of two or more second electrodes 40.

In this embodiment, the main source of carbon nanostructure production is by building them up from components of a gas—although some are produced by consumption of the second electrodes 40. Therefore, it is desirable to have a slow consumption of the second electrodes 40 in order to lengthen the time for arc-discharge which, in turn, increases the amount of, carbon nanostructures which can be produced with one set of electrodes 40. In order to increase the duration of arc-discharge, the first electrode 20 is connected to a positive voltage potential so as to act as an anode, whereas the second electrodes 40 are connected to a negative voltage potential so as to act as a cathode. That is, the voltage potentials are switched from the arrangements used in the first and second embodiments in order to slow consumption of the second electrodes 40.

In this embodiment, similar to the first embodiment, the soot containing carbon nanostructures is deposited on the inner wall surface 3 of the chamber 1.

It is contemplated that numerous modifications may be made to the arc electrode assembly of the present invention without departing from the spirit and scope of the invention as defined in the claims.

It should be understood that various change and modifications to the presently preferred embodiments describes herein will be apparent to those skilled in the art. Such changes and modifications can be made without diminishing its intended spirit and scope of the present invention and without diminishing its intended advantages. Its is therefore intended that such changes and modifications be covered by the appended claims.

What is claimed is:

1. An arc electrode assembly comprising:
   a chamber;
   a first electrode having a first end, a second end, and a body extending between the first end and the second end, wherein the first electrode is disposed in the chamber and connected to a first potential; and
   at least two second electrodes each having a first end and a second end, the at least two second electrodes being disposed in the chamber and being connected to a second potential, wherein the second ends of the at least two second electrodes are disposed opposite the first end of the first electrode so as to form a gap between each of the second electrodes and the first electrode, wherein at least one of the first electrode and the at least two second electrodes includes carbon.

2. The arc electrode assembly according to claim 1, wherein the body of the first electrode has a central bore therein and defines a longitudinal axis, wherein the first end of the first electrode includes a sloped surface which extends in a direction that is oblique to the longitudinal axis, and wherein the second ends of the at least two second electrodes are disposed opposite the sloped surface so as to form the gap.

3. The arc electrode assembly according to claim 2, wherein the central bore is a blind bore extending from the sloped surface into the body of the first electrode thereby forming a bottom surface.

4. The arc electrode assembly according to claim 3, wherein the first electrode is disposed below the at least two second electrodes so that unwanted byproducts are collected in the central bore.

5. The arc electrode assembly according to claim 2, wherein the sloped surface has a plurality of holes formed therein.

6. The arc electrode assembly according to claim 5, wherein the plurality of holes includes holes of different depths.

7. The arc electrode assembly according to claim 2, wherein the central bore extends entirely through the first electrode so that the body of the first electrode is tubular, and wherein the arc electrode assembly further comprises a pump that communicates with the central bore so as to pump material from the chamber through the central bore.

8. The arc electrode assembly according to claim 7, further comprising a collection box disposed between the pump and the central bore so as to receive material pumped through the central bore.

9. The arc electrode assembly according to claim 1, further comprising an adjusting mechanism connected to the first ends of the at least two second electrodes and to the chamber so that the second electrodes are movable with respect to one another and are movable with respect to the first electrode.

10. The arc electrode assembly according to claim 1, wherein
    the first electrode is disposed below the at least two second electrodes; wherein
    the first potential is positive so that the first electrode acts as an anode, and the second potential is negative so that the at least two second electrodes act as cathodes; and wherein the body of the first electrode has a central bore therein and defines a longitudinal axis, the central bore extending entirely through the first electrode so that the body of the first electrode is tubular, whereby gas can be introduced into the chamber through the central bore.

11. The arc electrode assembly according to claim 1, wherein the at least two second electrodes are spaced from one another, and are spaced from the first electrode allowing production of a converged arc.

12. The arc electrode assembly according to claim 1, wherein the first electrode is rotatably mounted with respect to the at least two second electrodes.

13. The arc electrode assembly according to claim 1, wherein the first electrode includes graphite, and the at least two second electrodes includes carbon.

14. An arc electrode assembly for producing carbon nanostructures comprising:
    a chamber;
    a first electrode disposed in the chamber, the first electrode having a first end, a second end, a longitudinal axis extending between the first end and the second end, and a body having a central bore extending along the longitudinal axis, wherein the first end includes a sloped surface which extends in a direction oblique to the longitudinal axis; and
    a second electrode disposed in the chamber and having a first end and a second end, the second end of the second electrode being disposed adjacent to the sloped surface so as to form a gap therebetween,
    wherein at least one of the first electrode and the second electrode includes carbon.

15. The arc electrode assembly according to claim 14, wherein the central bore is a blind bore extending from the sloped surface into the body of the first electrode thereby forming a bottom surface.

16. The arc electrode assembly according to claim 15, wherein the first electrode is disposed below the second electrode so that unwanted byproduct deposits are collected in the central bore.

17. The arc electrode assembly according to claim 14, wherein the sloped surface has a plurality of holes formed therein.

18. The arc electrode assembly according to claim 17, wherein the plurality of holes includes holes of varying depths.

19. The arc electrode assembly according to claim 14, wherein the central bore extends entirely through the first electrode so that the body of the first electrode is tubular and wherein, the arc electrode assembly further comprises a pump that communicates with the central bore so as to pump material from the chamber through the central bore.

20. The arc electrode assembly according to claim 19, further comprising a collection box disposed between the pump and the central bore so as to receive material pumped through the central bore.

21. The arc electrode assembly according to 14, further comprising at least two of the second electrodes.

22. The arc electrode assembly according to claim 21, further comprising an adjusting mechanism connected to the first ends the second electrodes and to the chamber so that the second electrodes are movable with respect to one another and are movable with respect to the first electrode.

23. The arc electrode assembly according to claim 21, wherein
    the first electrode is disposed below the at least two second electrodes; wherein
    the first electrode is connected to a positive potential so at the first electrode acts as an anode, and the at least two second electrodes are connected to a negative potential that is negative so that the at least two second electrodes act as cathodes; and wherein
    the body of the first electrode has a central bore therein and defines a longitudinal axis, the central bore extending entirely through the first electrode so that the body of the first electrode is tubular, whereby gas can be introduced into the chamber through the central bore.

24. The arc electrode assembly according to claim 21, wherein the at least two second electrodes are spaced from one another, and are spaced from the first electrode thereby producing a converged arc.

25. The arc electrode assembly according to claim 21, wherein the first electrode is rotatably mounted with respect to the at least two second electrodes.

26. The arc electrode assembly according to claim 14, wherein the first electrode includes graphite, and the second electrodes include carbon.

27. A process for producing carbon nanostructures, the process comprising the steps of:
    disposing a first graphite electrode and at least two carbon second electrodes in a chamber, having walls, so that the at least two second electrodes are opposed to the first electrode across a gap;

providing an atmosphere inside the chamber, wherein the atmosphere includes an inert gas and a first pressure; and producing a voltage across the at least two second electrodes and the first electrode thereby forming an arc between each of the at least two second electrodes and the first electrode allowing production of carbon nanostructures, wherein the at least two second electrodes are so constructed and arranged that a combined arc associated with the at least two second electrode is produced as voltage is produced across same.

28. The method as set forth in claim 27, wherein the first electrode includes a bore therethrough, and the method further comprises the steps of:

providing a suction through the bore so as to draw the gas and the carbon nanostructures out of the chamber, wherein the carbon nanostructures are annealed by heat from the first electrode; and supplying a gas to the chamber so as to maintain the chamber at the first pressure.

29. The method as set forth in claim 28, wherein the step of providing suction includes providing an amount of suction to prevent an appreciable amount of soot from forming on the walls.

30. The method as set forth in claim 27, wherein the first electrode includes a bore therethrough, and the method further comprises:

introducing organic vapor and catalyst into the chamber by passing the organic vapor and catalyst through the bore and through the arcs, wherein the catalyst and organic vapor are heated by the first electrode before the organic vapor and catalyst are passed through the arcs.

* * * * *